United States Patent [19]
Mizuno et al.

[11] Patent Number: 4,729,424
[45] Date of Patent: Mar. 8, 1988

[54] COOLING SYSTEM FOR ELECTRONIC EQUIPMENT

[75] Inventors: Tsukasa Mizuno; Minoru Okano, both of Tokyo, Japan

[73] Assignee: NEC Corporation, Japan

[21] Appl. No.: 52,174

[22] Filed: Apr. 30, 1987

Related U.S. Application Data

[63] Continuation-in-part of Ser. No. 846,860, Apr. 1, 1986, abandoned.

[30] Foreign Application Priority Data

Apr. 5, 1985 [JP] Japan ............................ 60-50927[U]
Apr. 11, 1985 [JP] Japan ................................ 60-75465

[51] Int. Cl.$^4$ ...................... G05D 23/19; F25B 29/00
[52] U.S. Cl. .................................. 165/30; 165/921; 165/80.4; 236/78 B; 62/175; 62/272; 357/82; 361/382; 174/15 R
[58] Field of Search ............... 165/30, 921, 80.4, 80.5; 236/78 B, 1 EA; 62/201, 196.1, 228.5, 175, 272; 357/82; 361/382, 381; 174/15 R

[56] References Cited

U.S. PATENT DOCUMENTS

| | | | |
|---|---|---|---|
| 3,227,207 | 1/1966 | Litman | 165/30 |
| 3,229,754 | 1/1966 | Hoag | 165/30 |
| 3,315,892 | 4/1967 | Haake | 236/78 B |
| 3,360,032 | 12/1967 | Sherwood | 165/30 |
| 3,992,894 | 11/1976 | Antonetti et al. | 165/11.1 |
| 3,993,123 | 11/1976 | Chu et al. | 165/80.4 |
| 4,072,181 | 2/1978 | Kostwa et al. | 165/30 |
| 4,109,707 | 8/1978 | Wilson et al. | 165/80.4 |
| 4,117,881 | 10/1978 | Williams et al. | 165/30 |
| 4,210,957 | 7/1980 | Spethmann | 236/1 EA |
| 4,495,780 | 1/1985 | Kaneko et al. | 361/381 |
| 4,535,602 | 8/1985 | Alsenz et al. | 236/1 EA |
| 4,582,124 | 4/1986 | Yoshimi et al. | 62/228.5 |

OTHER PUBLICATIONS

Yamatake-Honeywell #A1-2158, Jul. 1981.
Yamatake-Honeywell A1-2157, Oct. 1983.
Omron Sysmac C500, no date.
Specifications A2411 Yamatake Kelso Co. Ltd., no date.

*Primary Examiner*—William R. Cline
*Assistant Examiner*—John K. Ford
*Attorney, Agent, or Firm*—Laff, Whitesel, Conte & Saret

[57] ABSTRACT

A cooling system for maintaining the temperature within electronic equipment has a circulation system for pumping a cooling liquid, such as water, through the electronic equipment where it picks up heat generated by the electronic equipment. The cooling liquid is pumped through a plurality of heat exchangers using a refrigerant which is, in turn, pumped through a compressor-condensor combination, each heat exchanger having approximately the same cooling capacity. A central control selects the number of heat exchangers which are to operate at any given time, on a basis of the differential in the temperature of the water being pumped into and out of the electronic equipment. This maintains a desired and relatively wide range of temperatures. A heating element selectively and controllably heats the cooled water to bring the wide range of temperatures to a selected and fixed temperature.

9 Claims, 6 Drawing Figures

COOLING SYSTEM FOR ELECTRONIC EQUIPMENT

This application is a continuation-in-part of application Ser. No. 06/846,860, filed Apr. 1, 1986, now abandoned.

BACKGROUND OF THE INVENTION

This invention relates to a cooling system for cooling an electronic system, such as a computer, or the like, with a liquid coolant.

Since a conventional cooling system uses liquid as a coolant, it is conceivable that a system, which comprises a heat exchange unit, may be used for cooling the coolant which has been heated by an electronic system which is to be cooled. A pump feeds the coolant from the heat exchange unit via an expansion tank to the electronic system. A sensor detects the temperature of the coolant which is fed from the pump. A control circuit controls the operation of the heat exchange unit in response to the temperature detected by the sensor.

In such a cooling system, the operation of a compressor provided in the heat exchange unit is started when the temperature detected by the sensor exceeds a first threshold value. Its operation is suspended when the detected temperature falls below a second threshold value which is set lower than the first threshold value. However, since the start and suspension operations of the heat exchange unit are repeated quite frequently, the durable life of the compressor in the unit is unavoidably shortened. On the other hand, if the difference between the first and the second threshold values is set at a large value to reduce the frequency of the above-mentioned operations, the minute and delicate adjustment of the temperature of the coolant cannot be achieved.

An object of this invention is, therefore, to provide a cooling system which is free from the above-mentioned disadvantages.

SUMMARY OF THE INVENTION

According to an aspect of the invention, a cooling system for cooling an electronic system comprises supply means for supplying a first liquid coolant to the electronic system to take heat out of the system. A discharge means discharges the liquid coolant which has been heated by the above-mentioned heat. A first temperature sensing means detects the temperature of the first liquid coolant which is to be fed to the supply means. A second temperature sensing means detects the temperature of the heated liquid coolant. A third temperature sensing means detects the temperature within the electronic system. A plurality of heat exchange units cools the heated liquid coolant which is to be changed into a second liquid coolant. An expansion tank has heating means for heating the second liquid coolant which is to be changed into the first liquid coolant. A first control means responds to the difference between the temperature detected by the first sensing means and the temperature detected by the second sensing means for determining the number of the heat exchange units which are to be operated and for controlling their operation. A second control means controls the heating means in response to the difference between the temperatures which are detected by the first sensing means and the third sensing means.

BRIEF DESCRIPTION OF THE DRAWINGS

Other features and advantages of the invention will become apparent from the following description when taken in conjunction with the accompanying drawings, in which.

In the drawings, the same reference numerals represent the same structural elements.

DETAILED DESCRIPTION OF THE PREFERRED EMBODIMENT

Figure 1:
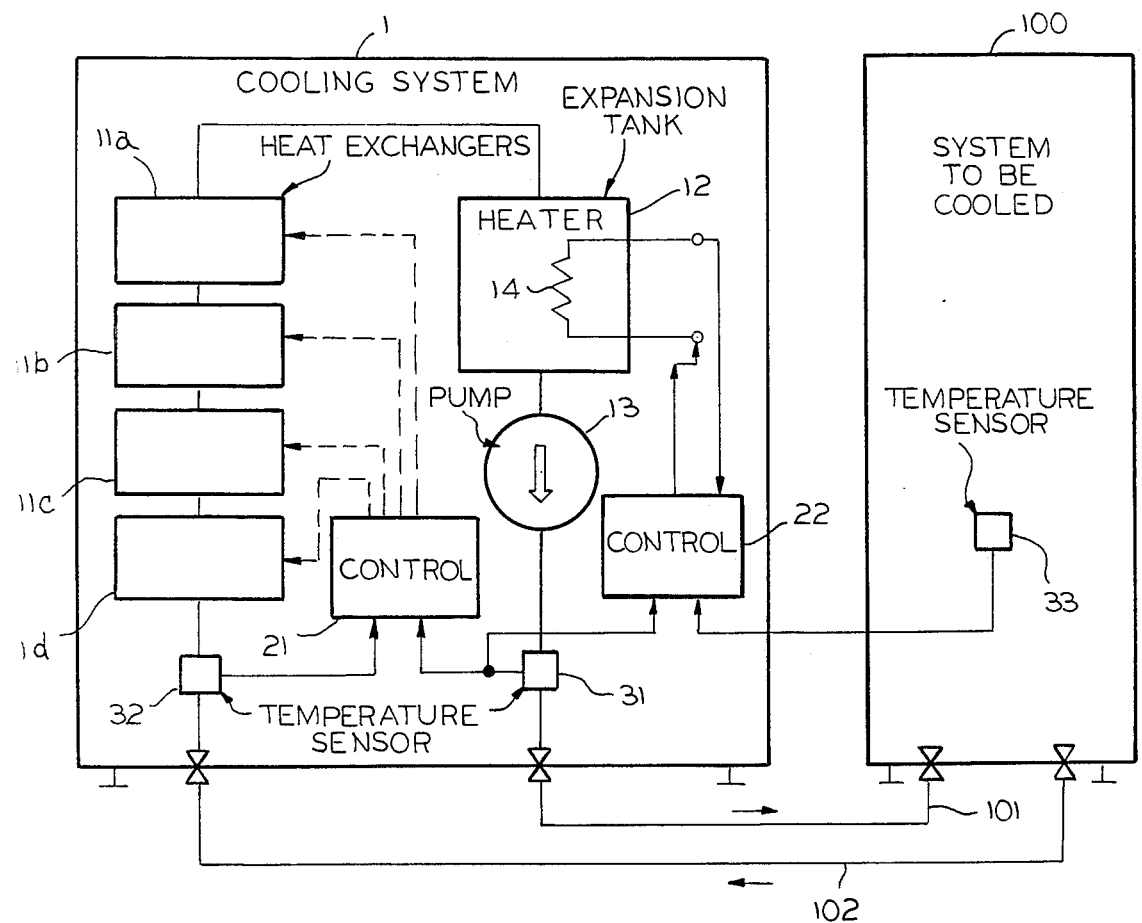
FIG. 1 is a block diagram of an embodiment of the invention.

Referring to FIG. 1, an embodiment of the invention comprises a system 100 to be cooled, such as a computer system, pipes 101 and 102, and a cooling system for feeding water as a coolant to the system 100 via the pipes 101 and 102. The system 100 is, for example, provided with a plurality of modules of the type disclosed in FIG. 1 of U.S. Pat. No. 3,993,123. A temperature sensor 33 is provided at a predetermined location within the system 100 to detect the temperature within the system 100. The temperature sensor 33 may be a temperature sensor which is available from Yamatake-Honeywell Co., Ltd. under the trade name SPC 620A.

The system 1 comprises four heat exchange units 11a through 11d, an expansion tank 12 having a heater 14 including a nichrome wire, or the like, a heat exchange unit control section 21, a heater control section 22, a pump 13, and temperature sensors 31 and 32. The expansion tank 12 absorbs a change in the volume of water which is dependent on a temperature change of the water, and on a flow rate change of the water. Such an expansion tank is disclosed in U.S. Pat. No. 3,992,894. In the embodiment, the water in such a tank is kept in contact with the nichrome wire. The water is heated by heat from the wire 14 as it is supplied with an electrical current. The pump 13 circulates the water via the pipes 101 and 102. The sensor 31 detects the temperature of the water which is to be fed to the pipe 101 while the sensor 32 detects the temperature of the water returned from the pipe 102. Each of the temperture sensors 31 and 32 may be, for example, a temperature sensor available from Yamatake-Honeywell Co., Ltd. under the trade name SPC 621A.

Figure 2:
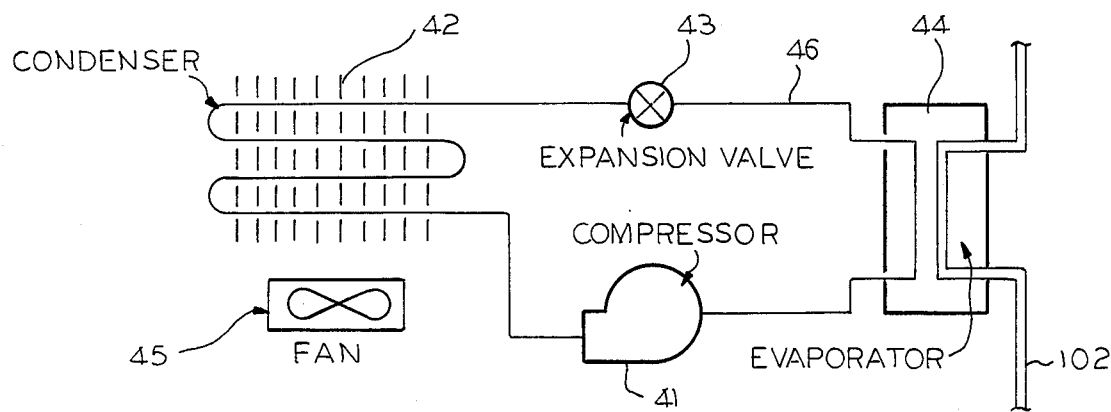
FIG. 2 is a diagram showing a heat exchange unit.

Referring now to FIGS. 1 and 2, each of the units 11a through 11d comprises a compressor 41, a condenser 42, an expansion valve 43, an evaporator 44, a pipe 46, and a fan 45. The heat of the water fed from the pipe 102 is conducted into a liquid freon flowing through the pipe 46 in the evaporator 44. The heat conducted to the liquid freon is radiated into the ambient air through the condenser 42. Units such as 11a through 11d have been generally used in ordinary air conditioners. It is assumed in the embodiment that the system 100 can be sufficiently cooled with at least three of the units 11a through 11d.

The operation of the cooling system 1 with the above-mentioned structure will next be described. The water drawn from the expansion tank 12 into the pump 13 is put under pressure by the pump 13 and supplied to the system 100 via the pipe 101. The water is heated by taking heat from modules within the system 100. That heated water passes through the pipe 102 to return to the system 1. The heated water is cooled by the heat exchange units 11a through 11d and then is returned to the expansion tank 12. In this manner, the water circulates through a closed loop. The temperature of the water is controlled by the two control sections 21 and 22.

Figure 3:
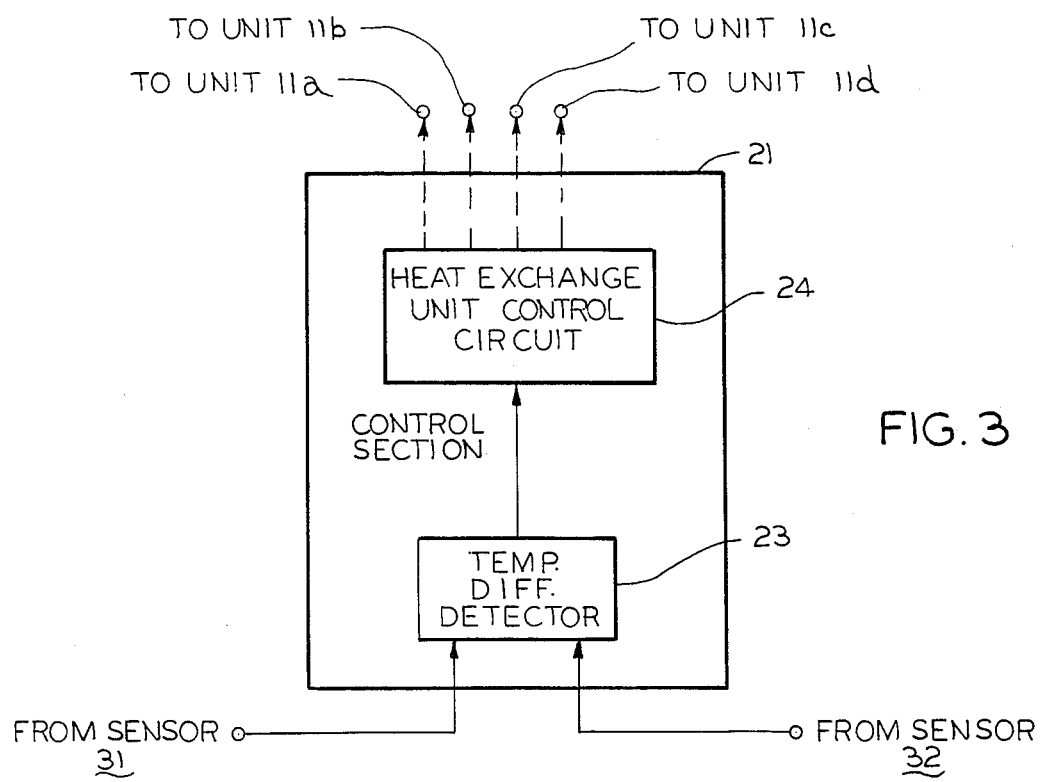
FIG. 3 is a block diagram of a control section for a heat exchange unit.

Referring to FIGS. 1 and 3, the control section 21 comprises a temperature difference detector 23 which detects the difference between the temperature of the water to be supplied to the outgoing pipe 101 and the temperature of the heated water returned from the pipe 102. These temperatures are represented by output signals from the temperature sensors 31 and 32. A heat exchange unit control circuit 24 determines the number of the heat exchange units 11a through 11d which are to be operated in accordance with the detected temperature difference. Control unit circuit 24 sequentially switches the heat exchange units which are to be operated on a time-sharing basis, and determines which heat exchange unit should be operated and which should be suspended. The detector 23 may be, for example, a circuit available from Yamatake-Honeywell Co., Ltd., under the trade name R7375D. The control circuit 24 may be constructed with a programmable controller available from Omron Tateishi Electronics Co., Ltd. under the trade name SYSMAC C500.

Figure 4:
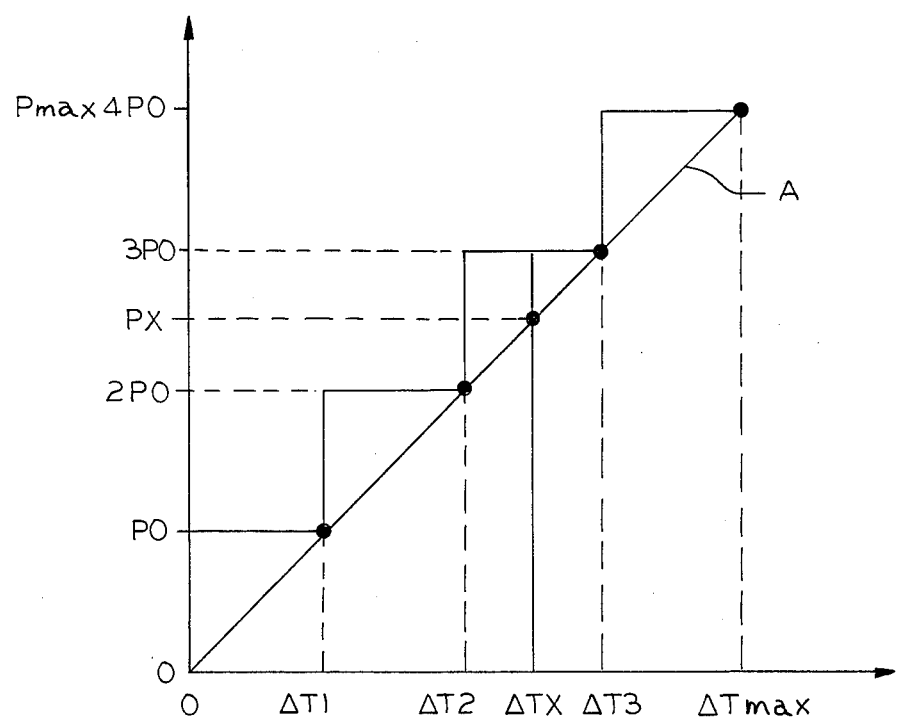
FIGS. 4 and 5 are diagrams for illustrating an operation of the control section shown in FIG. 3.

Referring to FIG. 4, a description will next be made of a method for determining the number of the heat exchange units which are to be operated. Assuming now that the flow rate of the water is constant, a temperature difference $\Delta T$ between the heated water fed from the system 100 and the cool water to be fed to the system 100 is in proportion to a calorie P, which the system 100 has taken. Based upon this proportional relationship, the relationship between the temperature difference $\Delta T$ and the calorie P is obtained, as represented by a line A in FIG. 4.

Temperature differences $\Delta T_1$, $\Delta T_2$, and $\Delta T_3$ for changing the number of the heat exchange units which are to be operated are obtainable from the above-mentioned relationship and from the cooling capability PO (represented by calorie) of each of the heat exchange units. Data which is indicative of these temperature differences, $\Delta T_1$, $\Delta T_2$, and $\Delta T_3$ are stored as thresholds in a memory (not shown) within the section 21 (FIG. 1). For example, when a temperature $\Delta T_X$ between the differences $\Delta T_2$ and $\Delta T_3$ is detected by the detector 23 in response to the signals from the sensors 31 and 32, the control circuit 24 (FIG. 3) performs the control so that three of the heat exchange units 11a through 11d operate.

Figure 5:
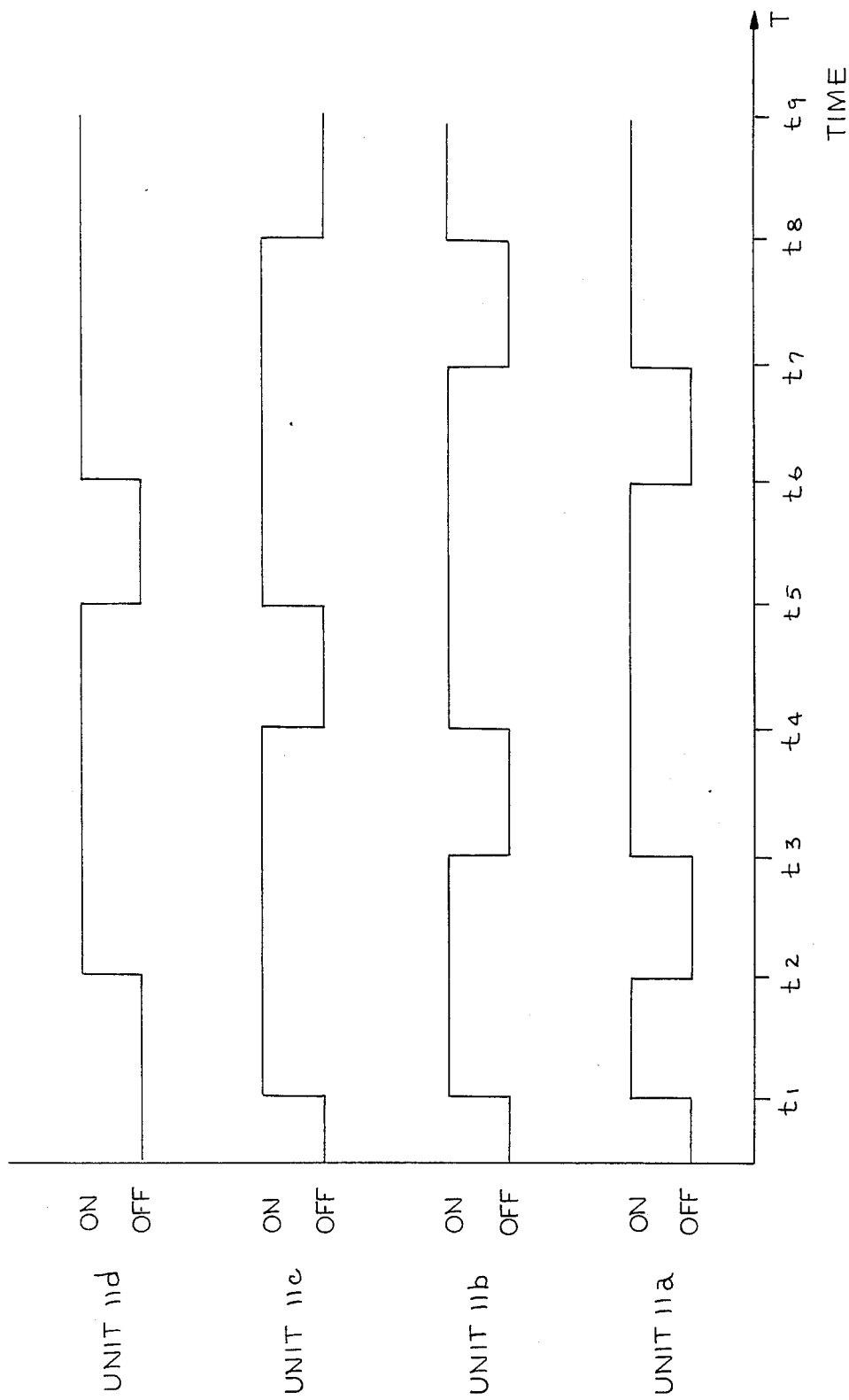

The control circuit 24 may perform an operation for switching the heat exchange units in a manner which is described below. As mentioned above, the system 100 can be sufficiently cooled with at least three heat exchange units. The heat exchange units 11a, 11b, 11c and 11d are controlled by the control section 21 so as to operate on a time sharing basis, as shown in FIG. 5. More particularly, at a time $t_1$, the heat exchange units 11a, 11b, and 11c start to operate while the heat exchange unit 11d stands by. At a time $t_2$, the operation of the unit 11a is suspended and the unit 11a switches into a stand-by state while the units 11b and 11c continue their operation and the unit 11d starts to operate. As the time elapses to pass onto times $t_3$, $t_4$, $t_5$, $t_6$ ..., the heat exchange units 11a, 11b, 11c and 11d, in turn, switch to the stand-by state, while the other three units assume an operating state.

Figure 6:
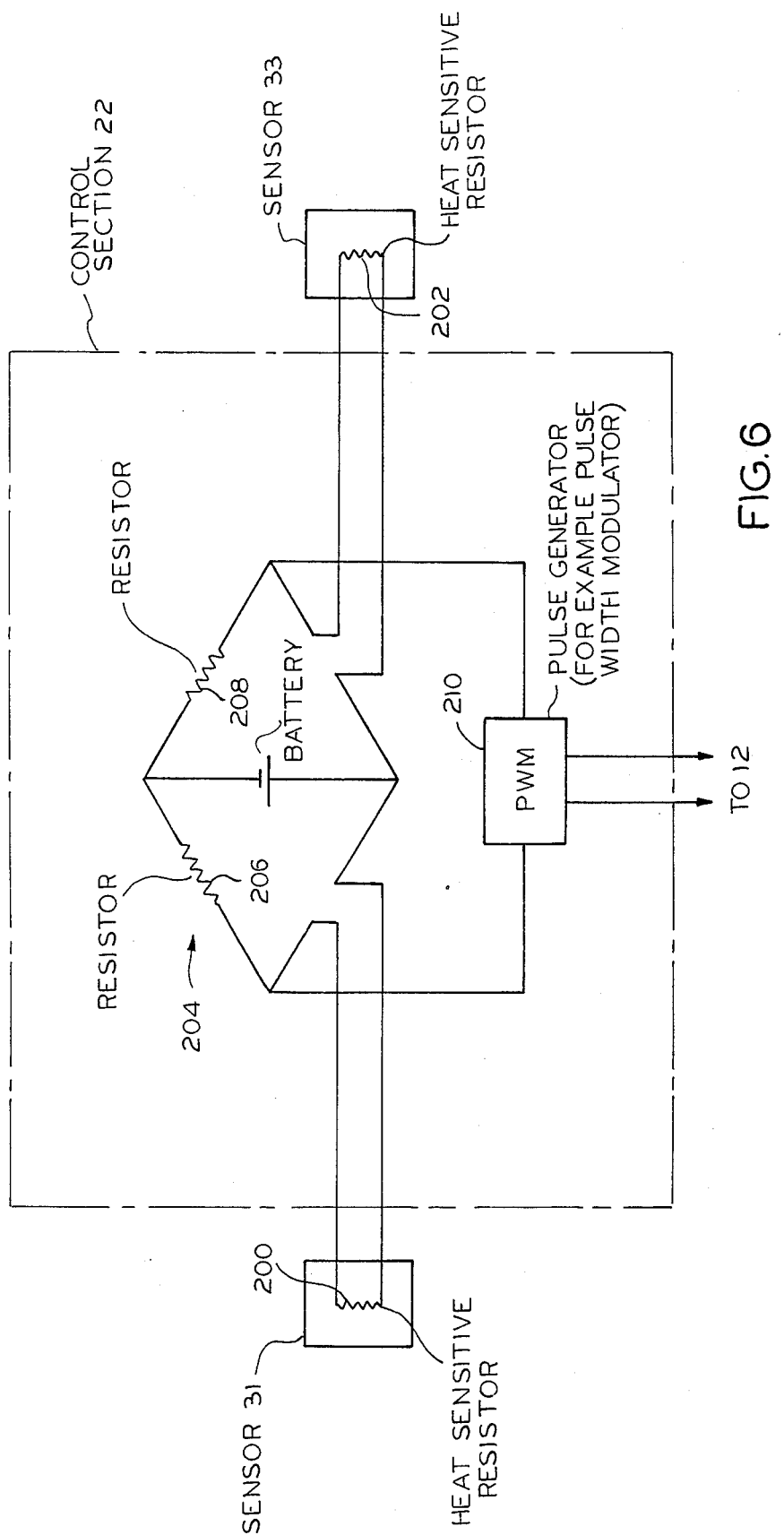
FIG. 6 is a schematic diagram showing the contents of control section 22.

The details of control section 22 are shown in FIGS. 1, 6. Each of the temperature sensors 31, 33 is a heat sensitive resistor 200, 202 which is connected into a bridge circuit 204. These resistirs are balanced against resistors 206, 208, which form the other two arms of bridge 204. Any suitable device 210, such as a pulse width modulator, may be used to control heat delivered from the heater 14.

The heater control section 22 controls the heater 14 in a manner which is described below. The section 22 may be structured with a circuit comprising a bridge circuit such as a well-known Wheatstone bridge and a pulse generator. Referring again to FIG. 1, the temperature sensor 33, within the system 100, detects the temperature within the system 100. In response to the temperatures detected by the sensors 31 and 33, the heater control section 22 continuously controls a heater 14 which is provided within the expansion tank 12. The temperature of the water to be fed to the system 100 is equal to or higher than the temperature within system 100. As a result, the condensation in the system 100 is completely prevented at any relative humidity.

More specifically, the sensors 31 and 33 comprise heat-sensitive resistirs having resistance values which vary in proportion to changes in the temperature. The heat-sensitive resistor of the sensor 31 forms one of four branches in the bridge circuit and the resistor of the sensor 33 forms another of the four branches. The other two branches are composed of adequate resistors. As a result, the bridge circuit produces a control signal corresponding to the difference between the temperatures detected by the sensors 31 and 33. The pulse generator generates a pulse train having a pulse width which varies in response to the control signal. Namely, the generator produces a pulse having a width which is comparatively long when the control signal indicates that the temperature detected by the sensor 31 is lower than the temperature detected by the sensor 33, and produces a pulse having a width which is comparatively short when the control signal indicates that the temperature detected by the sensor 31 is higher than the temperature detected by the sensor 33. The heater 14 operates during the presence of pulses supplied from the generator. Consequently, if the temperature of the water to be fed to the system 100 is lower than the temperature within the system 100, the section 22 controls the heater 14 to operate it for a comparatively long period of time to raise the water temperature. However, if the water temperature which is to be fed to system 100 is higher than the temperature within the system 100, the section 22 controls the heater 14 to operate it for a comparatively short period of time.

As is obvious from FIG. 4, since the control section 21 determines the number of the heat exchange units which are to be operated so as to keep the cooling capability higher than the calorie P of the water which has been taken from the system 100. These heat exchange units may overly cool the water. Therefore, to maintain thermal balance through a full heating of the overly cooled water, the heating capability of the heater 14 is slightly higher than the cooling capability of one heat exchange unit. In FIG. 4, at a temperature difference $\Delta T_X$, three heat exchange units are oprated, so that the cooling ability becomes redundant by $(3PO - PX)$ (wherein PX is the cooling ability required for cooling the calories corresponding to the difference ΔTX). This excess (3PO−PX) of the cooling ability is offset by the heater 14.

As described in the foregoing, the frequency of start/suspension of the operation of the compressor 41 within each heat exchange unit can be considerably reduced due to the minute adjustment in the water temperature which is achieved by the heater 14 according to this invention. If the time sharing operation, as described in reference to FIG. 5 is not required, the necessity to start or suspend the operation of the compressor 41 can be made almost null. Further, when any of the heat exchange units operating on a time sharing basis breaks down, it can be backed up immediately by another unit which has been placed in a stand-by condition. Thus, the broken unit can quickly be repaired or replaced with a new one to further improve the reliability of the whole system to be cooled.

While this invention has been described in conjunction with the preferred embodiments thereof, it will readily be possible for those skilled in the art to put this invention into practice in various other manners.

What is claimed is:

1. A cooling system for controlling the temperature of electronic equipment, said cooling system comprising a circulation system for conveying a cooling liquid into, through and out of said equipment, said cooling liquid being heated by heat of said equipment while it flows through said equipment; a plurality of heat exchangers for removing heat from said cooling liquid after it leaves said equipment, each of said heat exchangers having a capacity for removing a predetermined amount of heat from said cooling liquid; control means responsive to a differential of temperatures of the cooling liquids flowing into and out of said equipment for operating a selected number of said heat exchangers which is required to maintain a relatively wide range of temperatures within said equipment; means in said circulating system for heating the cooling liquid before it enters into said equipment; and said control means being further responsive to temperature sensing means within said equipment for controlling said heating means to maintain the temperature of the liquid coolant to be fed to said electronic system equal to or higher than the temperature within said electronic system.

2. The system of claim 1 and an expansion tank means containing said heating mleans for accommodating volume changes in said cooling liquid.

3. The system of claim 1 and means wherein said control means selects said heat exchangers for operation in a predetermined cycle whereby each heat exchanger operates for a first period in said cycle and stands by for a second period in said cycle during which at least one other heat exchanger operates.

4. The system of claim 1 wherein said cooling liquid is water and wherein each of said heat exchange units includes a refrigerant pumped through a compressor-condensor combination for removing heat from said water.

5. The system of claim 1 wherein said differential temperature is sensed by temperature sensor means in said system, one of said temperature sensor means measuring the temperature of said cooling liquid before it enters into said equipment, the other of said temperature sensor means measuring the temperature of said cooling liquid after it leaves said equipment, said control means responding to said temperature mesurements from said two temperature sensor means for finding said differential of temperature.

6. The system of claim 5 and an expansion tank means containing said heating means for accommodating volume changes in said cooling liquid.

7. The system of claim 6 wherein said cooling liquid is water and wherein each of said heat exchange units includes a refrigerant pumped through a compressor-condensor combination for removing heat from said water.

8. A cooling system for cooling an electronic system comprising:
supply means for supplying a liquid coolant to said electronic system to take heat from the system;
discharge means for discharging from said electronic system said liquid coolant which has been heated with said heat;
first temperature sensing means for detecting the temperature of said liquid coolant before it is supplied to said supply means;
second temperature sensing means for detecting the temperature of said liquid coolant discharged from said discharge means;
third temperature sensing means for detecting the temperature within said electronic system;
a plurality of heat exchange units for cooling said liquid coolant discharged from said discharge means;
an expansion tank having heating means for heating said liquid coolant supplied from said heat exchange units;
first control means responsive to the difference between the temperature detected by said first temperature sensing means and the temperature detected by said second temperature sensing means for determining the number of said plurality of heat exchange units which is to be operated and for controlling their operations; and
second control means for controlling said heating means in response to the temperature difference between the temperature detected by said first temperature sensing means and the temperature detected by said third temperature sensing means so as to keep the temperature of said liquid coolant to be fed to said electronic system equal to or higher than the temperature within said electronic system.

9. A cooling system as claimed in claim 8, wherein said first control means controls said heat exchange units, so that said determined number of said heat exchange units operate constantly, said first control means periodically rotating the operation of said heat exchange means between said plurality of heat exchange units so that each of said heat exchange units periodically switches between operate and standby conditions.

* * * * *